(12) United States Patent
Chen et al.

(10) Patent No.: US 12,495,647 B2
(45) Date of Patent: Dec. 9, 2025

(54) LIGHT SOURCE DEVICE AND MANUFACTURING METHOD OF LIGHT SOURCE DEVICE

(71) Applicant: Coretronic Corporation, Hsin-Chu (TW)

(72) Inventors: Chien-Chih Chen, Hsin-Chu (TW); Ming-Wei Tsai, Hsin-Chu (TW); Chung-Jen Ou, Hsin-Chu (TW); Yu-Min Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 328 days.

(21) Appl. No.: 18/316,193

(22) Filed: May 11, 2023

(65) Prior Publication Data

US 2023/0369546 A1 Nov. 16, 2023

Related U.S. Application Data

(60) Provisional application No. 63/340,949, filed on May 12, 2022.

(30) Foreign Application Priority Data

Jul. 14, 2022 (CN) .......................... 202210830714.X (51) Int. Cl.
*H01L 25/075* (2006.01)
*H10H 20/819* (2025.01)
*H10H 20/851* (2025.01)

(52) U.S. Cl.
CPC ..... *H10H 20/8512* (2025.01); *H01L 25/0753* (2013.01); *H10H 20/819* (2025.01)

(58) Field of Classification Search
CPC ............. H10H 20/8512; H10H 20/819; H10H 20/0361; H10H 20/0363; H10H 20/8513;
(Continued)

(56) References Cited

U.S. PATENT DOCUMENTS 6,791,261 B1 9/2004 Shimoda et al.
9,507,206 B2 11/2016 Li
(Continued)

FOREIGN PATENT DOCUMENTS

CN 111667777 A 9/2020
CN 111863854 10/2020
(Continued)

OTHER PUBLICATIONS

"Office Action of Taiwan Counterpart Application", issued on May 15, 2023, p. 1-p. 10.
(Continued)

*Primary Examiner* — Elias Ullah
(74) *Attorney, Agent, or Firm* — JCIPRNET (57) ABSTRACT

A light source device and a manufacturing method of the light source device is provided. The light source device includes a micro light-emitting element layer, a transparent substrate and a wavelength conversion module. The wavelength conversion module includes a first wavelength conversion layer, a second wavelength conversion layer, a light transmission layer, multiple barrier structures, multiple reflection layers and a light cut-off layer. The first wavelength conversion layer, the second wavelength conversion layer, and the light transmission layer are arranged in an arrangement direction. Any two of the first wavelength conversion layer, the second wavelength conversion layer, and the light transmission layer are separated from each other by one of the barrier structures. The reflection layers are located between the barrier structures and any one of a sidewall of the first wavelength conversion layer, a sidewall of the second wavelength conversion layer, and a sidewall of the light transmission layer.

17 Claims, 7 Drawing Sheets

(58) Field of Classification Search
CPC ...... H10H 20/84; H10H 20/01; H10H 20/856; H01L 25/0753
See application file for complete search history.

(56) References Cited

U.S. PATENT DOCUMENTS

| | | |
|---|---|---|
| 2017/0294418 A1 | 10/2017 | Edmond et al. |
| 2018/0371315 A1 | 12/2018 | Hofmann et al. |
| 2019/0004346 A1 | 1/2019 | Klippstein et al. |

FOREIGN PATENT DOCUMENTS

| | | |
|---|---|---|
| CN | 114420718 | 4/2022 |
| TW | 202109918 | 3/2021 |
| TW | I771883 | 7/2022 |

OTHER PUBLICATIONS

"Office Action of China counterpart Application", issued on Sep. 29 2025, p. 1-p. 7.

LIGHT SOURCE DEVICE AND MANUFACTURING METHOD OF LIGHT SOURCE DEVICE

CROSS-REFERENCE TO RELATED APPLICATION

This application claims the priority benefit of U.S. provisional application Ser. No. 63/340,949, filed on May 12, 2022 and China application serial no. 202210830714.X, filed on Jul. 14, 2022. The entirety of each of the above-mentioned patent applications is hereby incorporated by reference herein and made a part of this specification.

BACKGROUND

Technical Field

The disclosure relates to an optical device and a manufacturing method of an optical device, and in particular relates to a light source device and a manufacturing method of a light source device.

Description of Related Art

In recent years, under the circumstance that the manufacturing cost of organic light-emitting diode (OLED) display panels is high and its service life may not compete with the current mainstream displays, micro light-emitting diode displays (Micro LED Displays) have gradually attracted the investment attention of various technology manufacturers. Micro LED displays have optical performance comparable to OLED display technology, such as high color saturation, fast response speed, high contrast, and have the advantages of low power consumption and long material service life. Generally speaking, the manufacturing technology of the micro LED display is to directly transfer the pre-fabricated micro LED die to the backplane of the driving circuit by adopting die transposition, which is the so-called mass transfer technology.

In order to meet the above-mentioned product requirements, a technology plan that utilizes a single color light (e.g., as blue light) micro LED element array to excite wavelength conversion materials (e.g., nano-scale phosphors or quantum dot materials) to form the required various color lights is proposed. However, such technical solutions have problems of low light conversion efficiency and the fact that the excitation light beam may not be completely absorbed, such that an accompanying converted light beam exits (e.g., blue light leakage), resulting in insufficient color purity of the emitted light.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention provides a light source device and a manufacturing method of a light source device, which has good optical efficiency.

The invention provides a manufacturing method of a light source device, which may manufacture a light source device with good optical efficiency.

In order to achieve one of, or portions of, or all of the above objectives or other objectives, an embodiment of the invention provides a light source device. The light source device includes a micro light-emitting element layer, a transparent substrate, and a wavelength conversion module. The transparent substrate has a first surface and a second surface opposite to each other. The wavelength conversion module is located between the micro light-emitting element layer and the first surface of the transparent substrate. The wavelength conversion module includes a first wavelength conversion layer, a second wavelength conversion layer, a light transmission layer, multiple barrier structures, multiple reflection layers, and a light cut-off layer. The first wavelength conversion layer, the second wavelength conversion layer, and the light transmission layer are arranged at intervals in an arrangement direction of the transparent substrate. Any two of the first wavelength conversion layer, the second wavelength conversion layer, and the light transmission layer are separated from each other by one of the barrier structures. The reflection layers are located between the barrier structures and any one of a sidewall of the first wavelength conversion layer, a sidewall of the second wavelength conversion layer, and a sidewall of the light transmission layer in the arrangement direction. The light cut-off layer is in contact with the first surface of the transparent substrate, in which the light cut-off layer is in contact with and overlaps the first wavelength conversion layer and the second wavelength conversion layer.

In order to achieve one of, or portions of, or all of the above objectives or other objectives, an embodiment of the invention provides a manufacturing method of a light source device. The manufacturing method of the light source device includes the following process. A transparent substrate is provided. The transparent substrate has a first surface and a second surface opposite to each other. A wavelength conversion module is formed on the first surface of the transparent substrate. A micro light-emitting element layer is formed on a side of the wavelength conversion module away from the transparent substrate. The forming method of the wavelength conversion module includes the following process. A light cut-off layer and multiple interval regions without the light cut-off layer are formed on the first surface of the transparent substrate. A first wavelength conversion layer and a second wavelength conversion layer are respectively formed on the light cut-off layer, and a light transmission layer is formed on the interval regions. The first wavelength conversion layer, the second wavelength conversion layer, and the light transmission layer are arranged at intervals in an arrangement direction of the transparent substrate. A reflection layer is respectively formed on a sidewall of the first wavelength conversion layer, a sidewall of the second wavelength conversion layer, and a partial region of a sidewall of the light transmission layer. Multiple barrier structures are formed in the sidewall of the first wavelength conversion layer, the sidewall of the second wavelength conversion layer, the sidewall of the light transmission layer and a region between adjacent two of the reflection layers.

In an embodiment of the invention, the micro light-emitting element layer has multiple micro light-emitting elements, and an area of an orthographic projection of the micro light-emitting elements on the transparent substrate overlaps an area of an orthographic projection of any one of the first wavelength conversion layer, the second wavelength conversion layer, and the light transmission layer on the transparent substrate.

In an embodiment of the invention, the micro light-emitting element layer has multiple micro light-emitting elements, and an area of an orthographic projection of the micro light-emitting elements on the transparent substrate does not overlap with an area of an orthographic projection of the barrier structures on the transparent substrate.

In an embodiment of the invention, each of the barrier structures has a first end portion, a second end portion, and a body portion connecting the first end portion and the second end portion. The first end portion is in contact with the micro light-emitting element layer. The second end portion is in contact with at least any one of the transparent substrate and the light cut-off layer. An area of an orthographic projection of the first end portion and the second end portion of each of the barrier structures on the transparent substrate is larger than an area of an orthographic projection of the body portion of each of the barrier structures on the transparent substrate.

In an embodiment of the invention, any one of the sidewall of the first wavelength conversion layer, the sidewall of the second wavelength conversion layer, and the sidewall of the light transmission layer has a body region corresponding to the body portion of each of the barrier structures, and each of the reflection layers is located between the body portion and the body region of any one of the sidewall of the first wavelength conversion layer, the sidewall of the second wavelength conversion layer, and the sidewall of the light transmission layer in the arrangement direction.

In an embodiment of the invention, the first end portion and the second end portion of each of the barrier structures protrude from both sides of the body portion in the arrangement direction to respectively form multiple protruding portions, and a thickness of each of the reflection layers in the arrangement direction is smaller than a length of each of the protruding portions in the arrangement direction.

In an embodiment of the invention, an area of an orthographic projection of the light cut-off layer on the transparent substrate does not overlap with an area of an orthographic projection of the light transmission layer on the transparent substrate.

In an embodiment of the invention, the light source device further includes an anti-reflection layer located on the second surface of the transparent substrate.

In an embodiment of the invention, the forming method of the micro light-emitting element layer on the side of the wavelength conversion module away from the transparent substrate includes aligning and bonding the micro light-emitting element layer on the side of the wavelength conversion module away from the transparent substrate.

In an embodiment of the invention, in the arrangement direction, any two of the sidewall of the first wavelength conversion layer, the sidewall of the second wavelength conversion layer, and the sidewall of the light transmission layer face each other across a first gap. In each of the first gaps, adjacent two of the reflection layers face each other across a second gap. The sidewall of the first wavelength conversion layer, the sidewall of the second wavelength conversion layer, and another partial region of the sidewall of the light transmission layer on which each of the reflection layers are not disposed on respectively face each other across a third gap and a fourth gap, in which the second gap is located between the third gap and the fourth gap, and the forming method of each of the barrier structures include the following process. A light masking material is filled into the third gap, the second gap, and the fourth gap, so as to respectively and correspondingly form a first end portion, a second end portion, and a body portion connecting the first end portion and the second end portion of each of the barrier structures.

In an embodiment of the invention, the manufacturing method of the light source device further includes the following process. An anti-reflection layer is formed on the second surface of the transparent substrate.

Based on the above, in the light source device in the embodiment of the invention, through the disposition of the reflection layer, the converted light beam or the excitation light beam transmitted sideways may be reflected by the reflection layer and repeatedly transmitted in the first wavelength conversion layer, the second wavelength conversion layer, or the light transmission layer until light is emitted from the first surface of the transparent substrate. In addition, through the disposition of the light cut-off layer, the portion of the excitation light beam that is not converted by the first wavelength conversion layer and the second wavelength conversion layer may be repeatedly transmitted in the first wavelength conversion layer and the second wavelength conversion layer through reflection by the light cut-off layer and the reflection layer to be converted again. In this way, both the optical efficiency and the conversion efficiency of the wavelength conversion module may be effectively improved.

The light source device and the manufacturing method of the light source device in the embodiments of the invention enable the light source device with a reflection layer to generate a light beam recycling function on a sideways direction, and increase the utilization rate of the excitation light beam and the generation rate of the converted light beam.

In addition, the light source device formed by the manufacturing method of the light source device of this embodiment only needs to perform one process of bonding and alignment, so the manufacturing is easy and the structure may have good precision. In addition, since the micro light-emitting element layer of the light source device is directly bonded to the wavelength conversion module, therefore, the loss of the light beam may also be reduced such that the optical efficiency is good, and at the same time, the thickness of the structure may be reduced such that there is an advantage for miniaturization.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWING

The accompanying drawings are included to provide a further understanding of the invention, and are incorporated in and constitute a part of this specification. The drawings illustrate examples of the invention and, together with the description, serve to explain the principles of the invention.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component "component is directly "adjacent to" "B" component or one or more additional components are between "A" component and "B" component. Accordingly, the drawings and descriptions will be regarded as illustrative in nature and not as restrictive.

Figure 1:
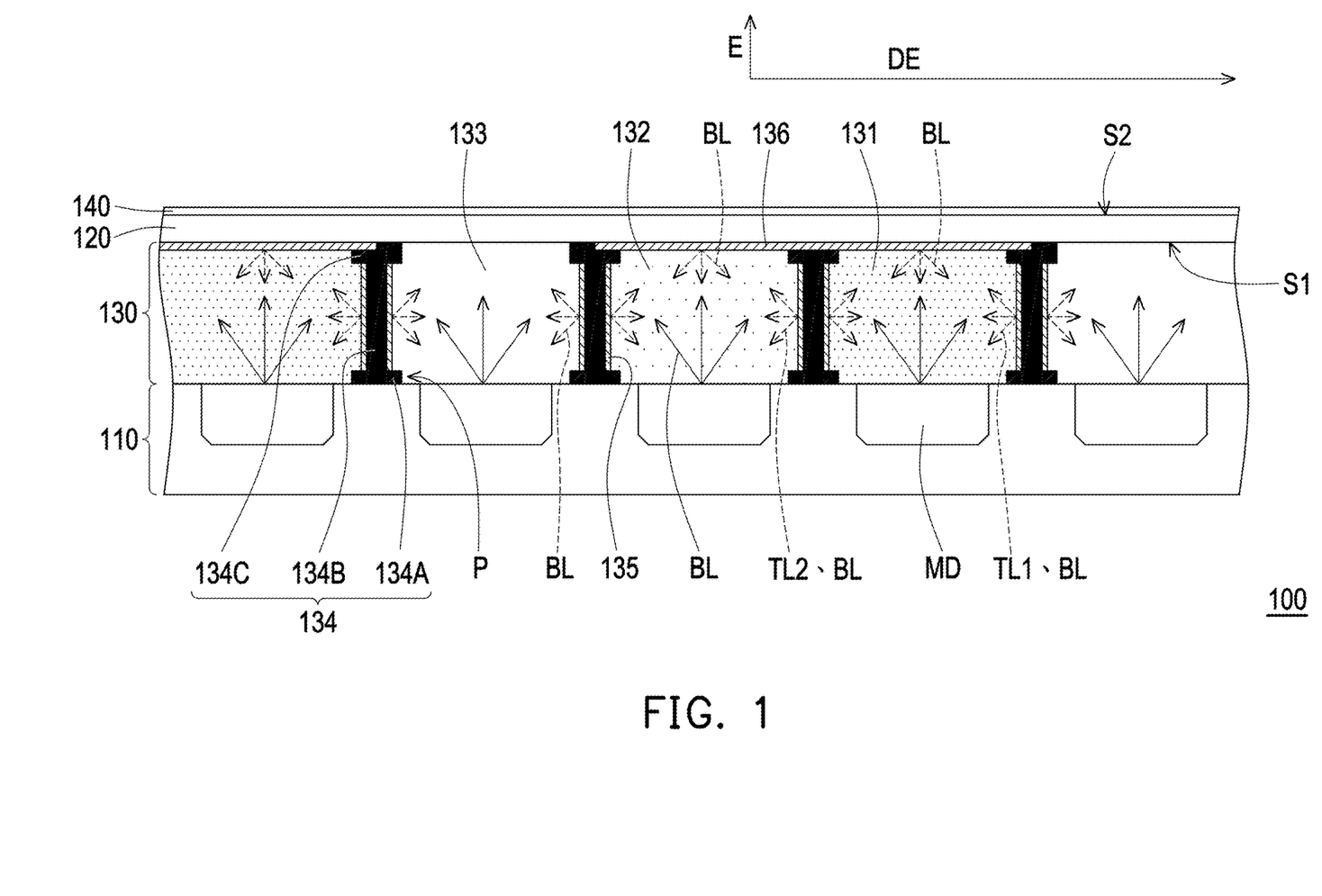
FIG. 1 is a structural schematic diagram of a light source device according to an embodiment of the invention.

FIG. 1 is a structural schematic diagram of a light source device according to an embodiment of the invention. FIG. 2A to FIG. 2G are schematic flowcharts of a manufacturing method of the light source device of FIG. 1. Referring to FIG. 1, in this embodiment, a light source device 100 includes a micro light-emitting element layer 110, a transparent substrate 120, a wavelength conversion module 130, and an anti-reflection layer 140. Specifically, as shown in FIG. 1, in this embodiment, the transparent substrate 120 has a first surface S1 and a second surface S2 opposite to each other, the wavelength conversion module 130 is located between the micro light-emitting element layer 110 and the first surface S1 of the transparent substrate 120, and the anti-reflection layer 140 is located on the second surface S2 of the transparent substrate 120.

Specifically, as shown in FIG. 1, in this embodiment, the micro light-emitting element layer 110 has multiple micro light-emitting elements MD, which are respectively used for providing multiple excitation light beams BL. For example, the micro light-emitting element MD is a blue micro light-emitting diode, and the emission wavelength of the excitation light beam BL ranges from, for example, 430 nm to 480 nm.

More specifically, the wavelength conversion module 130 includes a first wavelength conversion layer 131, a second wavelength conversion layer 132, a light transmission layer 133, multiple barrier structures 134, multiple reflection layers 135, and a light cut-off layer 136. The first wavelength conversion layer 131, the second wavelength conversion layer 132, and the light transmission layer 133 are arranged at intervals in an arrangement direction DE of the transparent substrate 120. To further illustrate, the barrier structures 134 are respectively disposed between the first wavelength conversion layer 131, the second wavelength conversion layer 132, and the light transmission layer 133. In addition, in this embodiment, when viewing the light source device 100 in the opposite direction of the exit direction E of the lighting beam, the first wavelength conversion layer 131, the second wavelength conversion layer 132, and the light transmission layer 133 are arranged in a matrix on the first surface S1 of the transparent substrate 120. The exit direction E of the lighting beam is perpendicular to the arrangement direction DE.

For example, in this embodiment, the materials of the first wavelength conversion layer 131 and the second wavelength conversion layer 132 are, for example, quantum dot materials or nano-scale phosphors. The first wavelength conversion layer 131 and the second wavelength conversion layer 132 are adapted to respectively convert the excitation light beam BL into multiple converted light beams TL1 and TL2. The emission wavelengths of the converted light beams TL1 and TL2 are different from the emission wavelength of the excitation light beam BL. For example, in this embodiment, the micro light-emitting element MD is a blue light micro light-emitting diode, the light-emitting wavelengths of the converted light beams TL1 and TL2 are, for example, in a range between about 590 nm to 700 nm and a range between about 500 nm to 570 nm, and the red light and the green light of the lighting beam provided by the light source device 100 may be respectively formed. It is worth mentioning that the lighting beam includes at least one of the excitation light beam BL, the red light, or the green light. The lighting beam exits the light source device 100 from the anti-reflection layer 140 toward the exit direction E of the lighting beam. In this embodiment, the material of the light transmission layer 133 is, for example, an optical adhesive material that allows the excitation light beam BL to pass through directly, but is not limited thereto. In this embodiment, the excitation light beam BL may be directly used as the blue light of the light source device 100, but in other embodiments, in order to improve the color purity of blue light (i.e., narrow the distribution range of the blue light wavelength), a filter element is disposed between the first surface S1 of the transparent substrate 120 and the light transmission layer 133, and the filter element is used to allow blue light of a specific wavelength to pass through. Alternatively, in order to convert blue light when other light sources are used, the wavelength conversion module 130 of other embodiments may also selectively dispose a blue light wavelength conversion material in the light transmission layer 133 to obtain blue light that meets the requirements.

As shown in FIG. 1, in this embodiment, any two of the first wavelength conversion layer 131, the second wavelength conversion layer 132, and the light transmission layer 133 are separated from each other by a barrier structure 134, and the reflection layers 135 are located between each of the barrier structures 134 and any one of the sidewall of the first wavelength conversion layer 131, the sidewall of the second wavelength conversion layer 132, and the sidewall of the light transmission layer 133 in the arrangement direction DE. For example, in this embodiment, the reflection layer 135 is a metal thin film, which may reflect light beams in all wavelength ranges, and the material of the barrier structure 134 may include black resin or light absorbing material for absorbing or blocking the excitation light beam BL.

Furthermore, as shown in FIG. 1, in this embodiment, the micro light-emitting element MD and the first wavelength conversion layer 131, the second wavelength conversion layer 132, and the light transmission layer 133 of the wavelength conversion module 130 only need to be aligned once, such that the area of the orthographic projection of the micro light-emitting element MD on the transparent substrate 120 overlaps the area of the orthographic projection of the first wavelength conversion layer 131, the second wavelength conversion layer 132, and the light transmission layer 133 on the transparent substrate 120. The area of the orthographic projection of any one of the first wavelength conversion layer 131, the second wavelength conversion layer 132, and the light transmission layer 133 on the transparent substrate 120 is larger than the area of the orthographic projection of the micro light-emitting element MD on the transparent substrate 120.

The area of the orthographic projection of the micro light-emitting element MD on the transparent substrate 120 does not overlap with the area of the orthographic projection of the barrier structure 134 on the transparent substrate 120. In this way, the excitation light beams BL provided by the micro light-emitting elements MD may correspondingly enter the first wavelength conversion layer 131, the second wavelength conversion layer 132, and the light transmission layer 133.

Further, as shown in FIG. 1, in this embodiment, the sidewall of any one of the first wavelength conversion layer 131, the second wavelength conversion layer 132, and the light transmission layer 133 is perpendicular to the first surface S1 of the transparent substrate 120, and the reflection layer 135 covers at least a portion of the area of the sidewall of the first wavelength conversion layer 131, the sidewall of the second wavelength conversion layer 132, and the sidewall of the light transmission layer 133. In this way, in the first wavelength conversion layer 131 and the second wavelength conversion layer 132 of the wavelength conversion module 130, the converted light beams TL1 and TL2 transmitted sideways may be reflected by the reflection layer 135 to convert the exit direction of the converted light beams TL1 and TL2 to be transmitted towards the transparent substrate 120. The converted light beams TL1 and TL2 are emitted from the first surface S1 of the transparent substrate 120. In this way, the optical efficiency of the wavelength conversion module 130 may be improved. On the other hand, in the first wavelength conversion layer 131 and the second wavelength conversion layer 132 of the wavelength conversion module 130, the excitation light beam BL transmitted sideways may be reflected by the reflection layer 135 and converted into the converted light beams TL1 and TL2 in the first wavelength conversion layer 131 and the second wavelength conversion layer 132. In this way, the optical conversion efficiency of the first wavelength conversion layer 131 and the second wavelength conversion layer 132 of the wavelength conversion module 130 may be improved. In addition, in the light transmission layer 133 of the wavelength conversion module 130, the excitation light beam BL transmitted sideways is reflected by the reflection layer 135 and transmitted in the light transmission layer 133 to be emitted from the first surface S1 of the transparent substrate 120. In this way, the optical efficiency of the wavelength conversion module 130 may be improved.

Furthermore, as shown in FIG. 1, in this embodiment, the light cut-off layer 136 is in contact with the first surface S1 of the transparent substrate 120. The light cut-off layer 136 is in contact with and overlaps the first wavelength conversion layer 131 and the second wavelength conversion layer 132. The light cut-off layer 136 is disposed between the transparent substrate 120 and the first wavelength conversion layer 131. Another light cut-off layer 136 is disposed between the transparent substrate 120 and the second wavelength conversion layer 132. For example, in this embodiment, the light cut-off layer 136 has a significant reflection effect on light beams with emission wavelengths less than 500 nm, and is transmissive to light beams with emission wavelengths greater than 500 nm. For example, the light cut-off layer 136 does not allow the excitation light beam BL to pass through, the light cut-off layer 136 may be used for reflecting the excitation light beam BL and allowing the converted light beams TL1 and TL2 to pass through.

Furthermore, as shown in FIG. 1, in this embodiment, the area of the orthographic projection of the light cut-off layer 136 on the transparent substrate 120 does not overlap with the area of the orthographic projection of the light transmission layer 133 on the transparent substrate 120. In this way, the excitation light beam BL may leave the wavelength conversion module 130 after passing through the light transmission layer 133 to form the blue light portion of the lighting beam provided by the light source device 100. On the other hand, in the first wavelength conversion layer 131 and the second wavelength conversion layer 132, the other portion of the excitation light beam BL that is not converted by the first wavelength conversion layer 131 and the second wavelength conversion layer 132 may be repeatedly transmitted in the first wavelength conversion layer 131 and the second wavelength conversion layer 132 to be converted again through the reflection of the light cut-off layer 136 and the reflection layer 135, in which only the converted light beams TL1 and TL2 may leave the wavelength conversion module 130 through the light cut-off layer 136, thereby forming the red light or the green light of the lighting beam provided by the light source device 100. In this way, the conversion efficiency of the wavelength conversion module 130 may be improved.

In this way, through the disposition of the reflection layer 135 and the light cut-off layer 136, both the optical efficiency and the conversion efficiency of the wavelength conversion module 130 may be effectively improved.

On the other hand, as shown in FIG. 1, in this embodiment, each of the barrier structures 134 has a first end portion 134A, a second end portion 134C, and a body portion 134B connecting the first end portion 134A and the second end portion 134C. The first end portion 134A is in contact with the micro light-emitting element layer 110, and at least one of the transparent substrate 120 and the light cut-off layer 136 is in contact with the second end portion 134C. Furthermore, the area of the orthographic projection of the first end portion 134A and the second end portion 134C of each of the barrier structures 134 on the transparent substrate 120 is larger than the area of the orthographic projection of the body portion 134B of each of the barrier structures 134 on the transparent substrate 120. That is to say, in this embodiment, the profile of each of the barrier structures 134 is, for example, similar to an I-shape.

Further, as shown in FIG. 1, in this embodiment, the first end portion 134A and the second end portion 134C of each of the barrier structures 134 protrude from both sides of the body portion 134B in the arrangement direction DE to respectively form multiple protruding portions P. Any one of the sidewall of the first wavelength conversion layer 131, the sidewall of the second wavelength conversion layer 132, and the sidewall of the light transmission layer 133 has a body region corresponding to the body portion 134B of each of the barrier structures 134. In the arrangement direction DE, each of the reflection layers 135 is located between the body portion 134B and the body region of any one of the sidewall of the first wavelength conversion layer 131, the sidewall of the second wavelength conversion layer 132, and the sidewall of the light transmission layer 133. The thickness of each of the reflection layers 135 in the arrangement direction DE is smaller than the length of each of the protruding portions P in the arrangement direction DE. That is to say, as shown in FIG. 1, each of the reflection layers 135 is surrounded by the protruding portions P at each of the end portions of each of the barrier structures 134, the body portion 134B, and the body region of any one of the sidewall of the first wavelength conversion layer 131, the sidewall of the second wavelength conversion layer 132, and the sidewall of the light transmission layer 133.

In this way, the disposition of the protruding portions P of each of the barrier structures 134 may be used to block the excitation light beam BL from entering the wavelength conversion module 130 at a large angle or to block the light beam reflected by the reflection layer 135 from leaving the wavelength conversion module 130 at a large angle. In this way, the range of the incident angle of the excitation light beam BL provided by the micro light-emitting element MD may be limited, or the range of the light emission angle of the converted light beams TL1 and TL2 leaving the wavelength conversion module 130 and the excitation light beam BL passing through the light transmission layer 133 may be limited, thereby the generation of stray light may be reduced.

The steps of the manufacturing method of the light source device 100 is further explained below with reference to FIG. 2A to FIG. 2G.

Figure 2A:
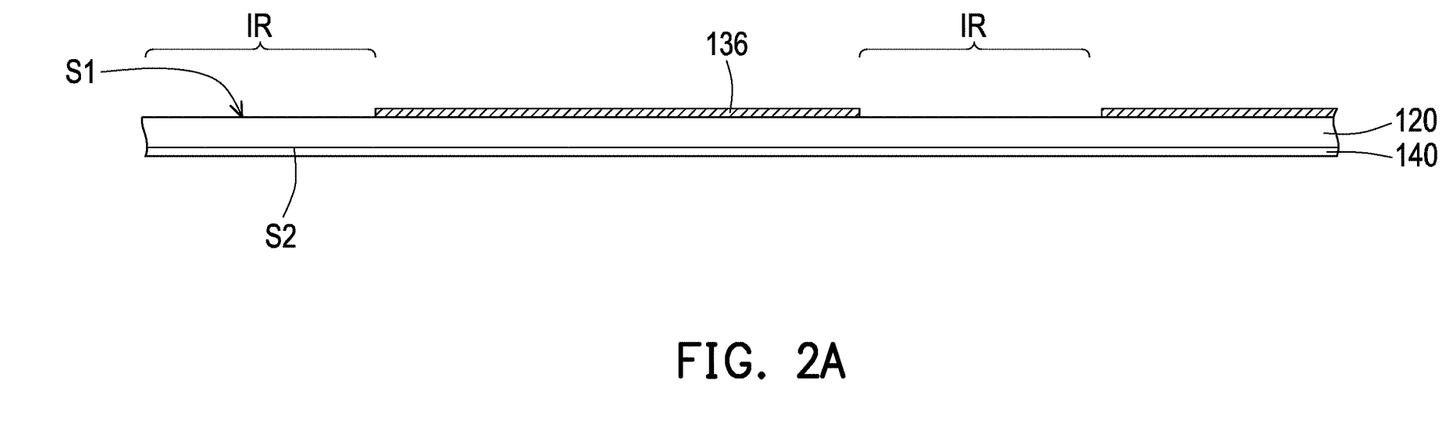
FIG. 2A to FIG. 2G are schematic flowcharts of a manufacturing method of the light source device of FIG. 1.

First, as shown in FIG. 2A, a transparent substrate 120 is provided and an anti-reflection layer 140 is formed on the second surface S2 of the transparent substrate 120. For example, the anti-reflection layer 140 is formed on the second surface S2 of the transparent substrate 120 by coating or film plating, and, as shown in FIG. 2A to FIG. 2F, the wavelength conversion module 130 is formed on the first surface S1 of the transparent substrate 120.

Further, as shown in FIG. 2A to FIG. 2F, the forming method of the wavelength conversion module 130 includes the following steps.

First, as shown in FIG. 2A, a light cut-off layer 136 and multiple interval regions IR are formed on the first surface S1 of the transparent substrate 120. The interval regions IR do not have the light cut-off layer 136.

Figure 2B:
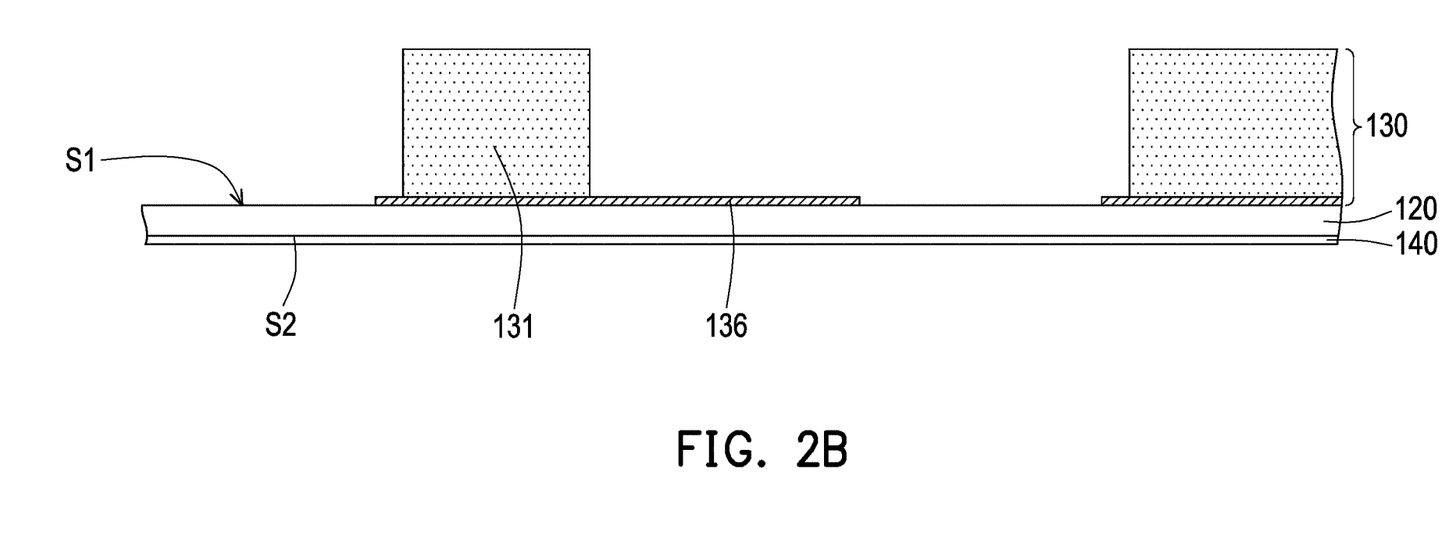
Figure 2C:
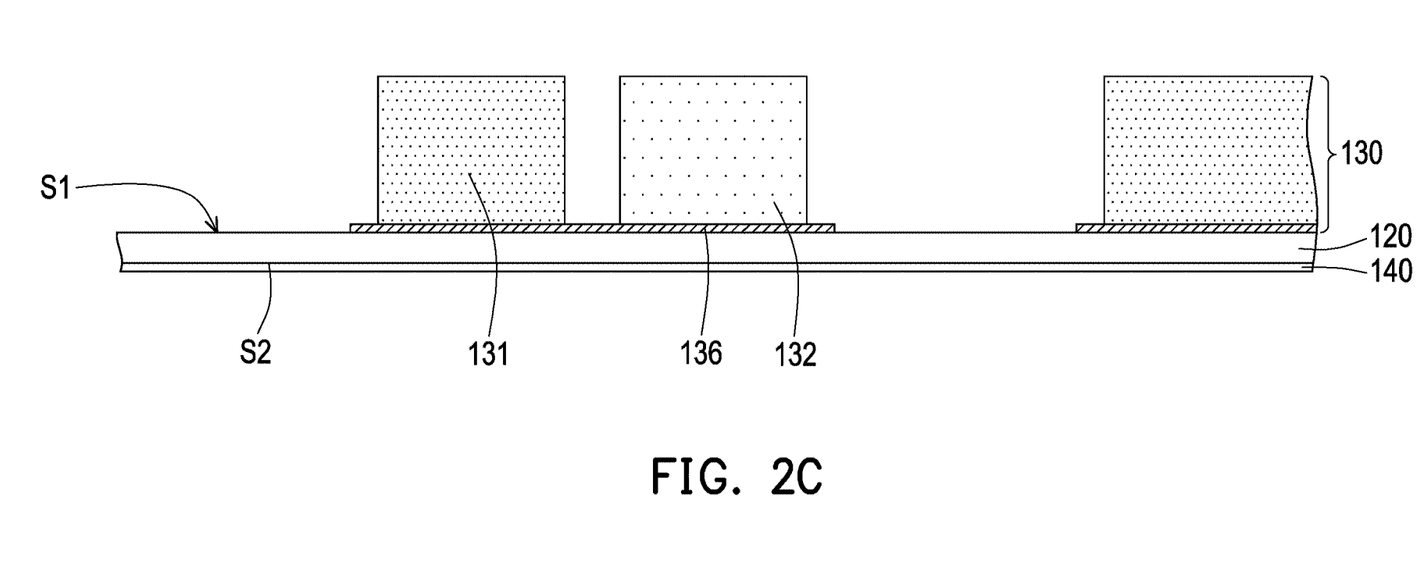
Figure 2D:
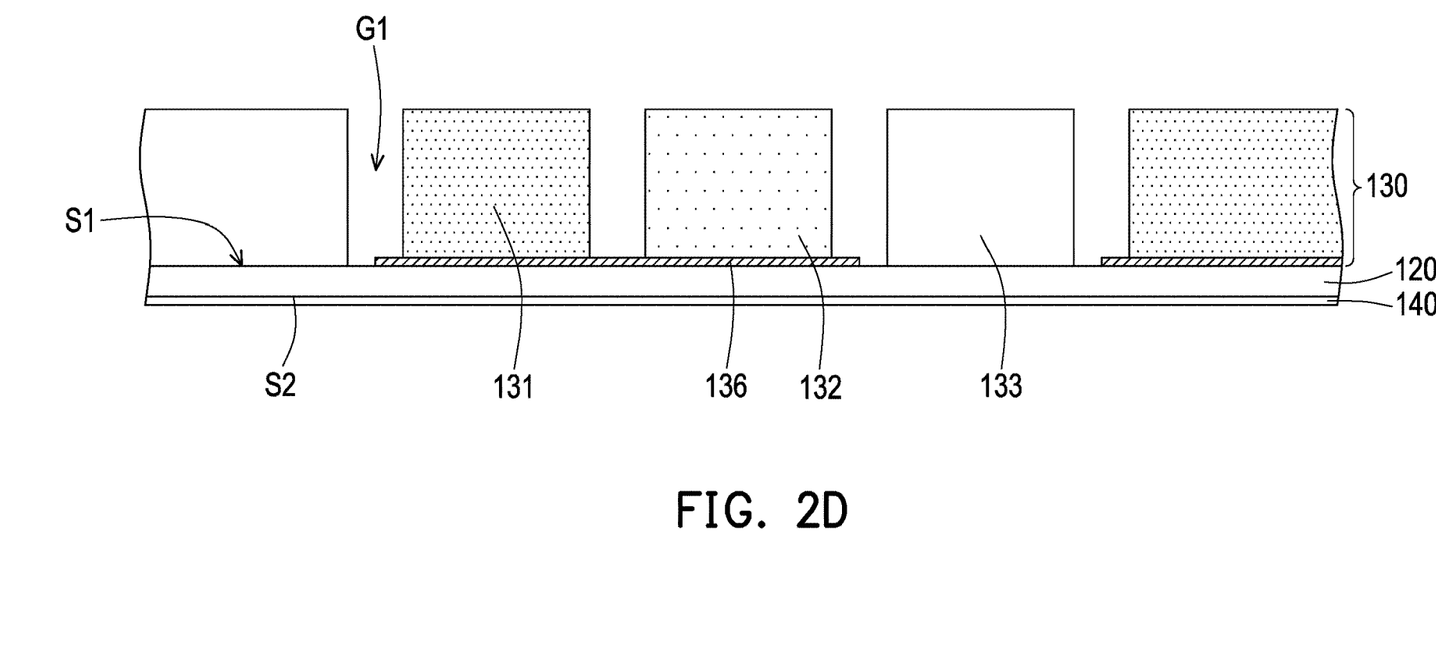

Next, as shown in FIG. 2B to FIG. 2D, a first wavelength conversion layer 131 and a second wavelength conversion layer 132 are respectively formed on the light cut-off layer 136 by a yellow light process, and a light transmission layer 133 is formed in the interval region IR. In this embodiment, the light transmission layer 133 directly contacts the transparent substrate 120. In addition, the first wavelength conversion layer 131 and the second wavelength conversion layer 132 are deposited on the light cut-off layer 136. For example, physical deposition or chemical deposition semiconductor processing methods are used. Further, as shown in FIG. 2D in this embodiment, the first wavelength conversion layer 131, the second wavelength conversion layer 132, and the light transmission layer 133 are arranged at intervals in the arrangement direction DE of the transparent substrate 120. In the arrangement direction DE, any two of the sidewall of the first wavelength conversion layer 131, the sidewall of the second wavelength conversion layer 132, and the sidewall of the light transmission layer 133 face each other across the first gap G1.

Figure 2E:
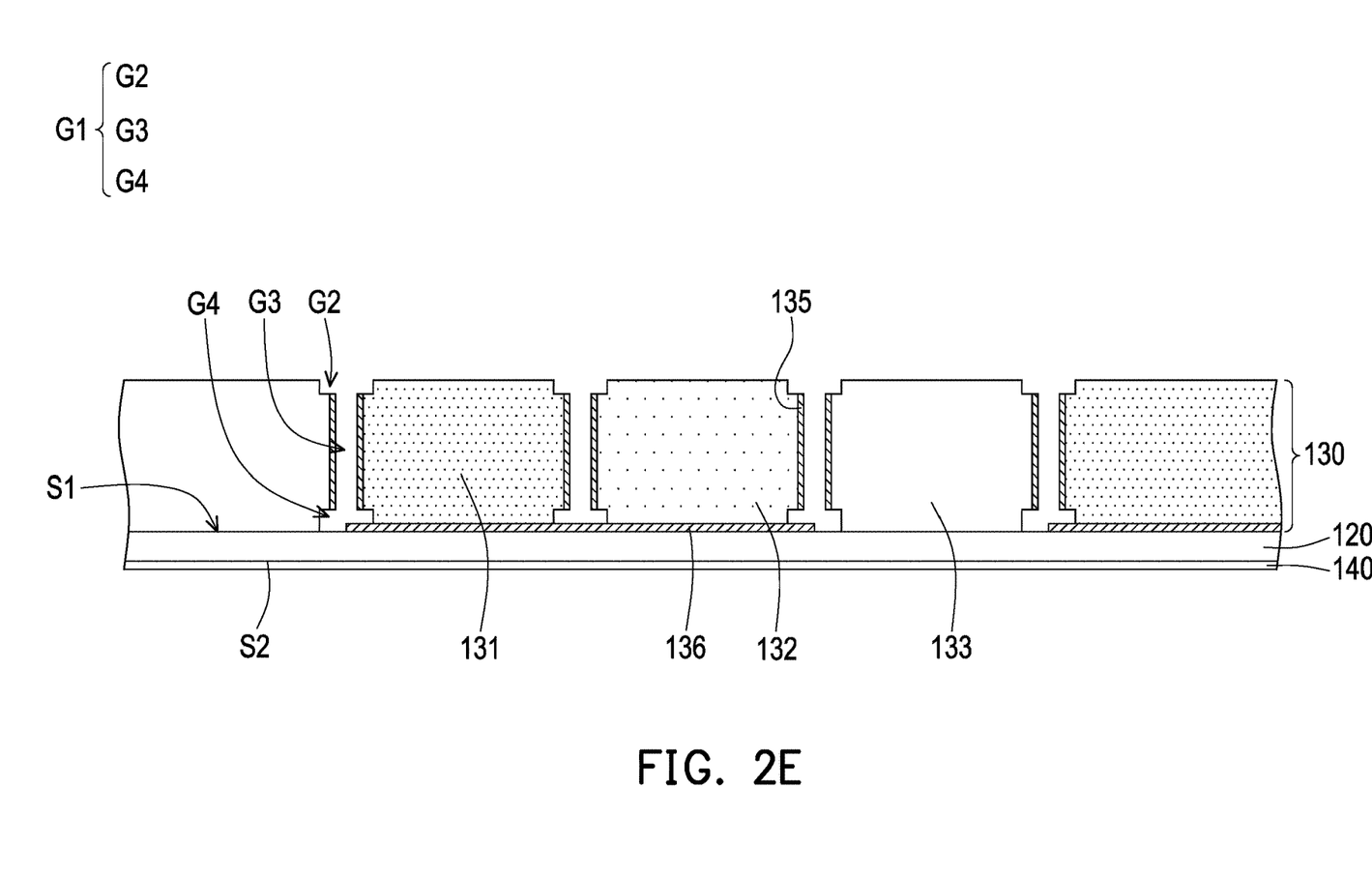

Next, as shown in FIG. 2E, reflection layers 135 are respectively formed on the sidewall of the first wavelength conversion layer 131, the sidewall of the second wavelength conversion layer 132, and a partial region of the sidewall of the light transmission layer 133. For example, the reflection layer 135 is film plated on the sidewall of the first wavelength conversion layer 131, the sidewall of the second wavelength conversion layer 132, and the sidewall of the light transmission layer 133.

Figure 2F:
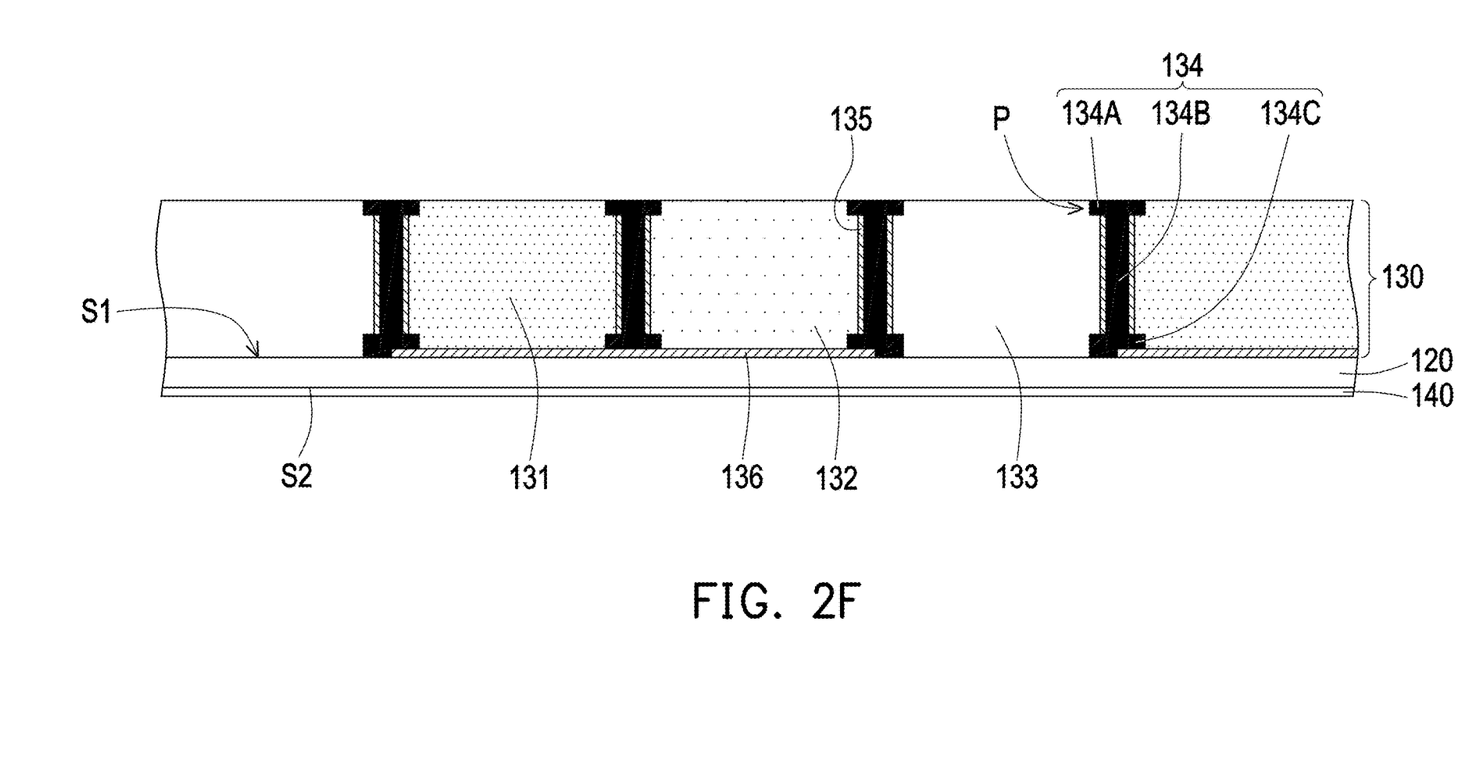

Next, as shown in FIG. 2F, multiple barrier structures 134 are formed between the sidewall of the first wavelength conversion layer 131, the sidewall of the second wavelength conversion layer 132, and two adjacent reflection layers 135 of the light transmission layer 133. To further illustrate, the barrier structure 134 is filled between the two reflection layers 135.

More specifically, as shown in FIG. 2E and FIG. 2F, in each of the first gaps G1, two adjacent reflection layers 135 face each other across a second gap G2. The sidewall of the first wavelength conversion layer 131, the sidewall of the second wavelength conversion layer 132, and another partial region of the sidewall of the light transmission layer 133 on which the reflection layer 135 is not disposed respectively face each other across a third gap G3 and a fourth gap G4. The second gap G2 is located between the third gap G3 and the fourth gap G4.

In this way, as shown in FIG. 2F, when each of the barrier structures 134 is formed, the light masking material used for forming the barrier structure 134 is filled into the third gap G3, the second gap G2, and the fourth gap G4, so as to respectively and correspondingly form the first end portion 134A, the second end portion 134C, and the body portion 134B connecting the first end portion 134A and the second end portion 134C of each of the barrier structures 134.

In this way, the wavelength conversion module 130 may be formed on the transparent substrate 120.

Figure 2G:
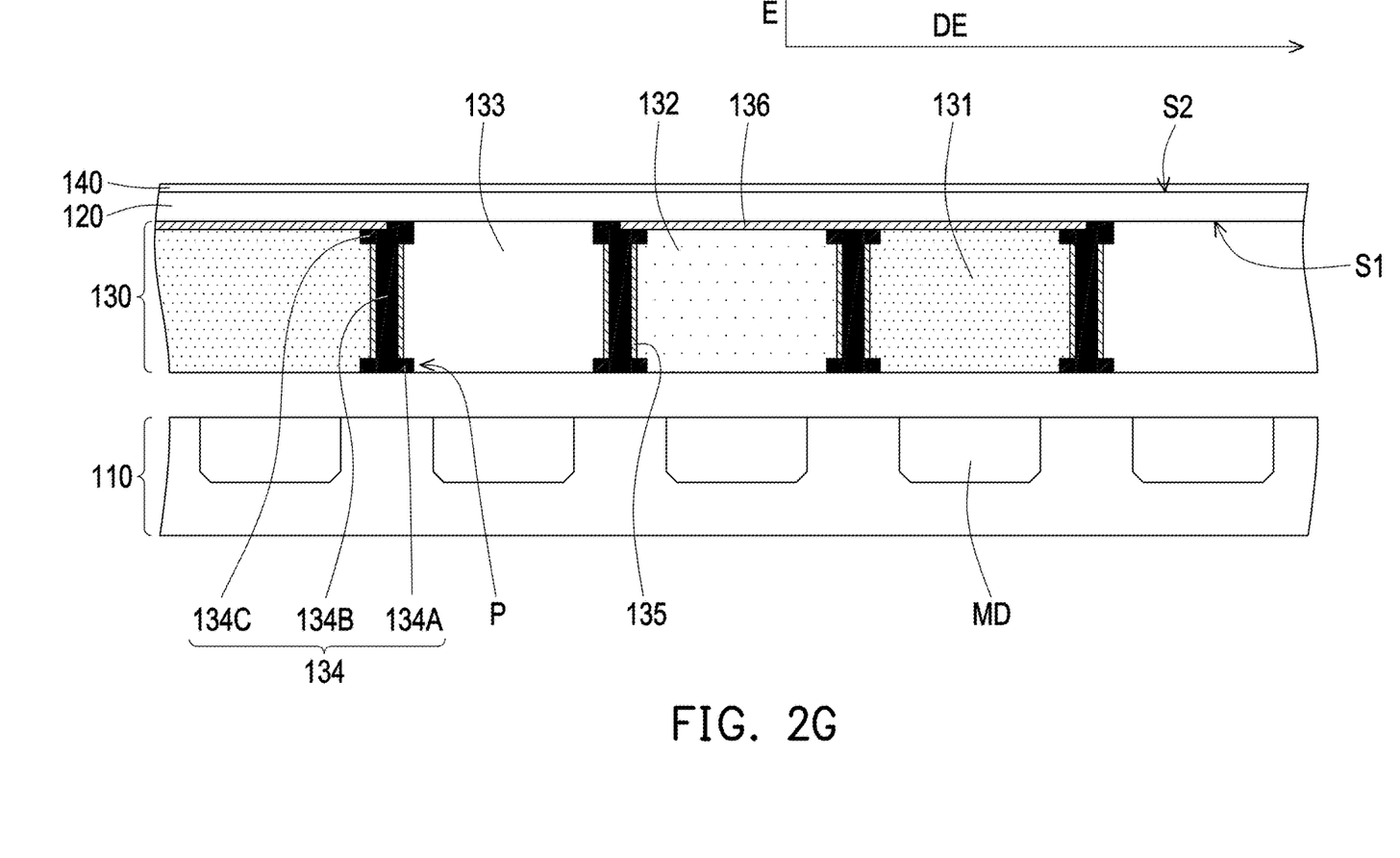

Next, a micro light-emitting element layer 110 is formed on one side of the wavelength conversion module 130 away from the transparent substrate 120, such that the light source device 100 may be formed. Specifically, in this embodiment, the forming method of the micro light-emitting element layer 110 on the side of the wavelength conversion module 130 away from the transparent substrate 120 includes aligning and bonding the micro light-emitting element layer 110 onto the side of the wavelength conversion module 130 away from the transparent substrate 120.

In this way, in the structure of the light source device 100 and the manufacturing method of the light source device 100 in this embodiment, the light source device 100 with the reflection layer 135 may generate a light beam recycling function on a sideways direction, and increase the utilization rate of the excitation light beam and the generation rate of converted light beams.

In the manufacturing method of the light source device 100 of this embodiment, there is only one process of bonding and alignment, which is easy to manufacture, and may reduce the risk of errors during bonding, so that the alignment between the micro light-emitting element MD of the micro light-emitting element layer 110 and the first wavelength conversion layer 131, the second wavelength conversion layer 132, and the light transmission layer 133 of the wavelength conversion module 130 has good precision. In addition, in this embodiment, since the micro light-emitting element layer 110 is directly bonded to the wavelength conversion module 130, therefore, the loss of the light beam may also be reduced such that the optical efficiency is good, and at the same time, the thickness of the structure may be reduced such that there is an advantage for miniaturization.

To sum up, in the light source device in the embodiment of the invention, through the disposition of the reflection layer, the converted light beam or the excitation light beam transmitted sideways may be reflected by the reflection layer and repeatedly transmitted in the first wavelength conversion layer, the second wavelength conversion layer, or the light transmission layer until light is emitted from the first surface of the transparent substrate. In addition, through the disposition of the light cut-off layer, the portion of the excitation light beam that is not converted by the first wavelength conversion layer and the second wavelength conversion layer may be repeatedly transmitted in the first wavelength conversion layer and the second wavelength conversion layer through reflection by the light cut-off layer and the reflection layer to be converted again. In this way, both the optical efficiency and the conversion efficiency of the wavelength conversion module may be effectively improved. In addition, the light source device formed by the manufacturing method of the light source device of this embodiment only needs to perform one process of bonding and alignment, so the manufacturing is easy and the structure may have good precision. In addition, since the micro light-emitting element layer of the light source device is directly bonded to the wavelength conversion module, therefore, the loss of the light beam may also be reduced such that the optical efficiency is good, and at the same time, the thickness of the structure may be reduced such that there is an advantage for miniaturization.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby enabling persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the present disclosure is intended to be dedicated to the public regardless of whether the element or component is explicitly recited in the following claims.

What is claimed is:

1. A light source device, comprising:
   a micro light-emitting element layer;
   a transparent substrate, having a first surface and a second surface opposite to each other; and
   a wavelength conversion module, located between the micro light-emitting element layer and the first surface of the transparent substrate, wherein the wavelength conversion module comprises:
   a first wavelength conversion layer, a second wavelength conversion layer, and a light transmission layer, wherein the first wavelength conversion layer, the second wavelength conversion layer, and the light transmission layer are arranged at intervals in an arrangement direction of the transparent substrate;
   a plurality of barrier structures, wherein any two of the first wavelength conversion layer, the second wavelength conversion layer, and the light transmission layer are separated from each other by one of the barrier structures;
   a plurality of reflection layers, located between the barrier structures and any one of a sidewall of the first wavelength conversion layer, a sidewall of the second wavelength conversion layer, and a sidewall of the light transmission layer in the arrangement direction; and
   a light cut-off layer, in contact with the first surface of the transparent substrate, wherein the light cut-off layer is in contact with and overlaps the first wavelength conversion layer and the second wavelength conversion layer.

2. The light source device according to claim 1, wherein the micro light-emitting element layer has a plurality of micro light-emitting elements, and an area of an orthographic projection of the micro light-emitting elements on the transparent substrate overlaps an area of an orthographic projection of any one of the first wavelength conversion layer, the second wavelength conversion layer, and the light transmission layer on the transparent substrate.

3. The light source device according to claim 1, wherein the micro light-emitting element layer has a plurality of micro light-emitting elements, and an area of an orthographic projection of the micro light-emitting elements on the transparent substrate does not overlap with an area of an orthographic projection of the barrier structures on the transparent substrate.

4. The light source device according to claim 1, wherein each of the barrier structures has a first end portion, a second end portion, and a body portion connecting the first end portion and the second end portion, the first end portion is in contact with the micro light-emitting element layer, the second end portion is in contact with at least any one of the transparent substrate and the light cut-off layer, and an area of an orthographic projection of the first end portion and the second end portion of each of the barrier structures on the transparent substrate is larger than an area of an orthographic projection of the body portion of each of the barrier structures on the transparent substrate.

5. The light source device according to claim 4, wherein any one of the sidewall of the first wavelength conversion layer, the sidewall of the second wavelength conversion layer, and the sidewall of the light transmission layer has a body region corresponding to the body portion of each of the barrier structures, and each of the reflection layers is located between the body portion and the body region of any one of the sidewall of the first wavelength conversion layer, the sidewall of the second wavelength conversion layer, and the sidewall of the light transmission layer in the arrangement direction.

6. The light source device according to claim 4, wherein the first end portion and the second end portion of each of the barrier structures protrude from both sides of the body portion in the arrangement direction to respectively form a plurality of protruding portions, and a thickness of each of the reflection layers in the arrangement direction is smaller than a length of each of the protruding portions in the arrangement direction.

7. The light source device according to claim 1, wherein an area of an orthographic projection of the light cut-off layer on the transparent substrate does not overlap with an area of an orthographic projection of the light transmission layer on the transparent substrate.

8. The light source device according to claim 1, further comprising:
an anti-reflection layer, located on the second surface of the transparent substrate.

9. A manufacturing method of a light source device, comprising:
providing a transparent substrate, wherein the transparent substrate has a first surface and a second surface opposite to each other;
forming a wavelength conversion module on the first surface of the transparent substrate, wherein forming the wavelength conversion module comprises:
forming a light cut-off layer and a plurality of interval regions without the light cut-off layer on the first surface of the transparent substrate;
respectively forming a first wavelength conversion layer and a second wavelength conversion layer on the light cut-off layer, and forming a light transmission layer on the interval regions, wherein the first wavelength conversion layer, the second wavelength conversion layer, and the light transmission layer are arranged at intervals in an arrangement direction of the transparent substrate;
respectively forming a reflection layer on a sidewall of the first wavelength conversion layer, a sidewall of the second wavelength conversion layer, and a partial region of a sidewall of the light transmission layer; and
forming a plurality of barrier structures in the sidewall of the first wavelength conversion layer, the sidewall of the second wavelength conversion layer, the sidewall of the light transmission layer and a region between adjacent two of the reflection layers; and
forming a micro light-emitting element layer on a side of the wavelength conversion module away from the transparent substrate.

10. The manufacturing method of the light source device according to claim 9, wherein forming the micro light-emitting element layer on the side of the wavelength conversion module away from the transparent substrate comprises aligning and bonding the micro light-emitting element layer on the side of the wavelength conversion module away from the transparent substrate.

11. The manufacturing method of the light source device according to claim 10, wherein the micro light-emitting element layer has a plurality of micro light-emitting elements, and an area of an orthographic projection of the micro light-emitting elements on the transparent substrate overlaps an area of an orthographic projection of any one of the first wavelength conversion layer, the second wavelength conversion layer, and the light transmission layer on the transparent substrate.

12. The manufacturing method of the light source device according to claim 10, wherein the micro light-emitting element layer has a plurality of micro light-emitting elements, and an area of an orthographic projection of the micro light-emitting elements on the transparent substrate does not overlap with an area of an orthographic projection of the barrier structures on the transparent substrate.

13. The manufacturing method of the light source device according to claim 9, wherein in the arrangement direction, any two of the sidewall of the first wavelength conversion layer, the sidewall of the second wavelength conversion layer, and the sidewall of the light transmission layer face each other across a first gap, and
in each of the first gaps, adjacent two of the reflection layers face each other across a second gap, and the sidewall of the first wavelength conversion layer, the sidewall of the second wavelength conversion layer, and another partial region of the sidewall of the light transmission layer on which each of the reflection layers are not disposed on respectively face each other across a third gap and a fourth gap, wherein the second gap is located between the third gap and the fourth gap, and forming each of the barrier structures comprises:
filling a light masking material into the third gap, the second gap, and the fourth gap, so as to respectively and correspondingly form a first end portion, a second end portion, and a body portion connecting the first end portion and the second end portion of each of the barrier structures.

14. The manufacturing method of the light source device according to claim 13, wherein the first end portion is in contact with the micro light-emitting element layer, the second end portion is in contact with at least any one of the transparent substrate and the light cut-off layer, and an area of an orthographic projection of the first end portion and the second end portion of each of the barrier structures on the transparent substrate is larger than an area of an orthographic projection of the body portion of each of the barrier structures on the transparent substrate.

15. The manufacturing method of the light source device according to claim 13, wherein any one of the sidewall of the first wavelength conversion layer, the sidewall of the second wavelength conversion layer, and the sidewall of the light transmission layer has a body region corresponding to the body portion of each of the barrier structures, and each of the reflection layers is located between the body portion and the body region of any one of the sidewall of the first wavelength conversion layer, the sidewall of the second wavelength conversion layer, and the sidewall of the light transmission layer in the arrangement direction.

16. The manufacturing method of the light source device according to claim 13, wherein the first end portion and the second end portion of each of the barrier structures protrude from both sides of the body portion in the arrangement direction to respectively form a plurality of protruding portions, and a thickness of each of the reflection layers in the arrangement direction is smaller than a length of each of the protruding portions in the arrangement direction.

17. The manufacturing method of the light source device according to claim 9, further comprising:

forming an anti-reflection layer on the second surface of the transparent substrate.

* * * * *